United States Patent
Shu et al.

(10) Patent No.: US 9,761,452 B1
(45) Date of Patent: Sep. 12, 2017

(54) DEVICES AND METHODS OF FORMING SADP ON SRAM AND SAQP ON LOGIC

(71) Applicant: GLOBALFOUNDRIES Inc., Grand Cayman (KY)

(72) Inventors: Jiehui Shu, Clifton Park, NY (US); Daniel Jaeger, Saratoga Springs, NY (US); Garo Jacques Derderian, Saratoga Spring, NY (US); Haifeng Sheng, Rexford, NY (US); Jinping Liu, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/205,528

(22) Filed: Jul. 8, 2016

(51) Int. Cl.
| | |
|---|---|
| *H01L 21/311* | (2006.01) |
| *H01L 21/033* | (2006.01) |
| *H01L 27/11* | (2006.01) |

(52) U.S. Cl.
CPC ...... *H01L 21/0338* (2013.01); *H01L 21/0335* (2013.01); *H01L 21/0337* (2013.01); *H01L 27/1104* (2013.01); *H01L 27/1116* (2013.01)

(58) Field of Classification Search
USPC ............................................. 438/696; 216/46
See application file for complete search history.

(56) References Cited

U.S. PATENT DOCUMENTS

2016/0133632 A1* 5/2016 Park ............... H01L 21/823828
257/369

* cited by examiner

*Primary Examiner* — Roberts Culbert
(74) *Attorney, Agent, or Firm* — Heslin Rothenberg Farley & Mesiti P.C.; Nathan B. Davis

(57) ABSTRACT

Devices and methods of fabricating integrated circuit devices with reduced cell height are provided. One method includes, for instance: obtaining an intermediate semiconductor device having a substrate including a logic area and an SRAM area, a fin material layer, and a hardmask layer; depositing a mandrel over the logic area; depositing a sacrificial spacer layer; etching the sacrificial spacer layer to define a sacrificial set of vertical spacers; etching the hardmask layer; leaving a set of vertical hardmask spacers; depositing a first spacer layer; etching the first spacer layer to define a first set of vertical spacers over the logic area; depositing an SOH layer; etching an opening in the SOH layer over the SRAM area; depositing a second spacer layer; and etching the second spacer layer to define a second set of spacers over the SRAM area.

15 Claims, 9 Drawing Sheets

US 9,761,452 B1

DEVICES AND METHODS OF FORMING SADP ON SRAM AND SAQP ON LOGIC

FIELD OF THE INVENTION

The present invention relates to semiconductor devices and methods of fabricating semiconductor devices, and more particularly, to devices and methods of forming SADP on the SRAM section and SAQP on the logic section of an integrated circuit.

BACKGROUND OF THE INVENTION

For SRAM cells, as the size of the cell shrinks, the height of the cell unfortunately is not shrinking. This is largely due to the use of self-aligned quadruple patterning (SAQP). The space between n fins can be as low as 82 nanometers (nm), p fins 48 nm, and between the n and the p fins can be as low as 54 nm. However, the cell height is not able to shrink below approximately 270 nm.

Therefore, it may be desirable to develop methods of fabricating semiconductor devices with a reduced cell height to increase the packing density.

BRIEF SUMMARY

The shortcomings of the prior art are overcome and additional advantage are provided through the provisions, in one aspect, a method that includes, for instance: obtaining an intermediate semiconductor device having a substrate including a logic area and an SRAM area, a fin material layer, and a hardmask layer; depositing a mandrel over the logic area; depositing a sacrificial spacer layer over the hardmask layer and the mandrel; etching the sacrificial spacer layer and removing the mandrel to define a sacrificial set of vertical spacers; etching the hardmask layer around the sacrificial set of vertical spacers; removing the sacrificial set of vertical spacers leaving a set of vertical hardmask spacers; depositing a first spacer layer over the fin material layer and the set of vertical hardmask spacers; etching the first spacer layer and removing the set of vertical hardmask spacers to define a first set of vertical spacers over the logic area; depositing a spin on hardmask (SOH) layer; etching an opening in the SOH layer over the SRAM area; depositing a second spacer layer; and etching the second spacer layer and removing the SOH layer to define a second set of spacers over the SRAM area.

In another aspect, an intermediate device is provided which includes, for instance: a substrate including a logic area and an SRAM area, a fin material layer, a first set of vertical spacers over the logic area; and a second set of spacers over the SRAM area.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, which provide advantages over the above noted, existing semiconductor devices and fabrication processes. Advantageously, the integrated circuit device fabrication processes disclosed herein provide for semiconductor devices with a lower line resistivity than previously possible using traditional copper lines.

Figure 1:
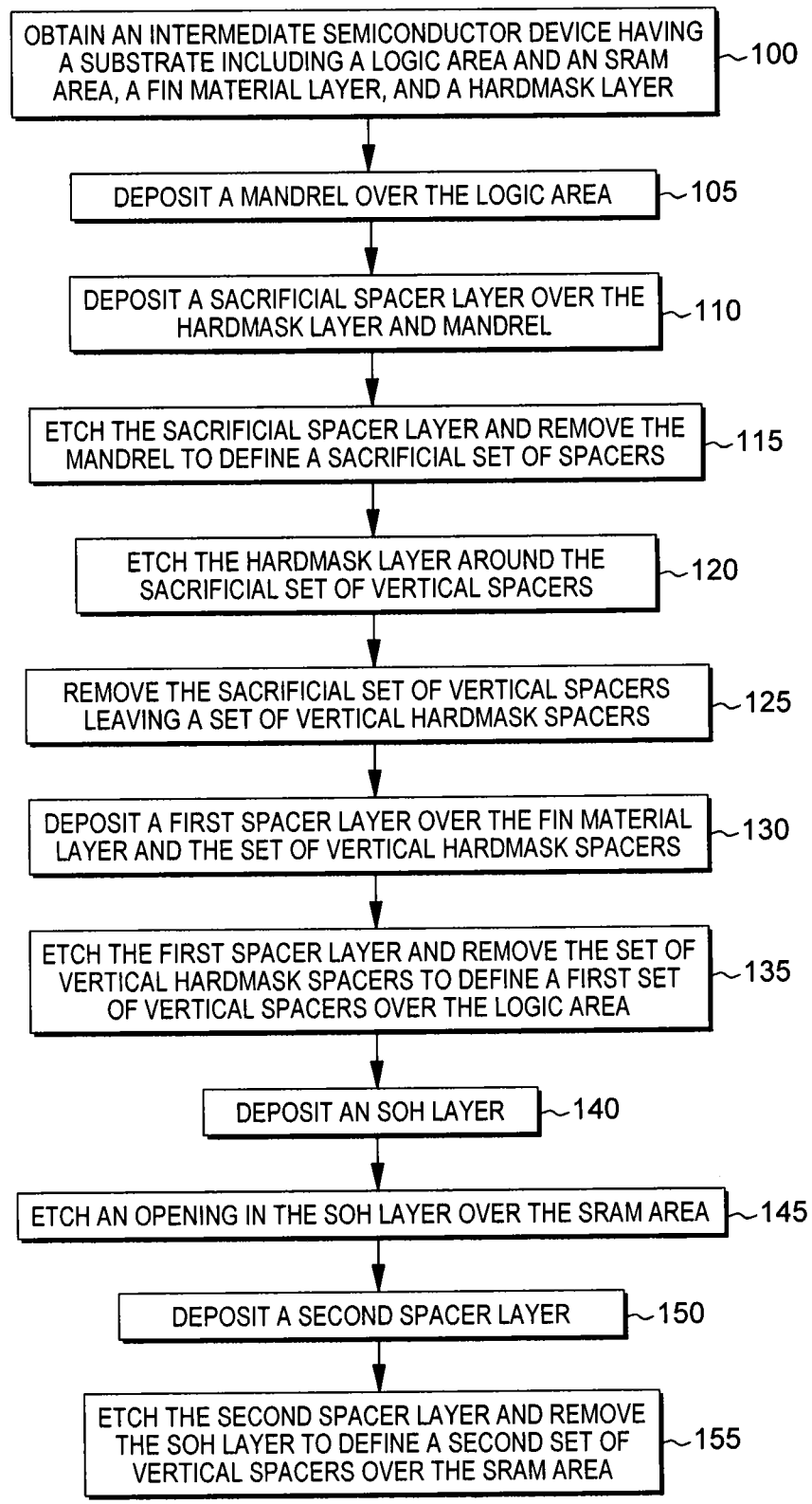
FIG. 1 depicts a flow diagram describing one embodiment of a method for forming an intermediate semiconductor structure, in accordance with one or more aspects of the present invention.

In one aspect, in one embodiment, as shown in FIG. 1, an integrated circuit device formation process in accordance with one or more aspects of the present invention may include, for instance: obtaining an intermediate semiconductor device having a substrate including a logic area and an SRAM area, a fin material layer, and a hardmask layer 100; depositing a mandrel over the logic area 105; depositing a sacrificial spacer layer over the hardmask layer and the mandrel 110; etching the sacrificial spacer layer and removing the mandrel to define a sacrificial set of vertical spacers 115; etching the hardmask layer around the sacrificial set of vertical spacers 120; removing the sacrificial set of vertical spacers leaving a set of vertical hardmask spacers 125; depositing a first spacer layer over the fin material layer and the set of vertical hardmask spacers 130; etching the first spacer layer and removing the set of vertical hardmask spacers to define a first set of vertical spacers over the logic area 135; depositing a spin on hardmask (SOH) layer 140; etching an opening in the SOH layer over the SRAM area 145; depositing a second spacer layer 150; and etching the second spacer layer and removing the SOH layer to define a second set of spacers over the SRAM area 155.

FIGS. 2-13 depict, by way of example only, one detailed embodiment of a portion of a semiconductor device formation process and a portion of an intermediate semiconductor structure, in accordance with one or more aspects of the present invention. Note that these figures are not drawn to scale in order to facilitate understanding of the invention, and that the same reference numerals used throughout different figures designate the same or similar elements.

Figure 2:
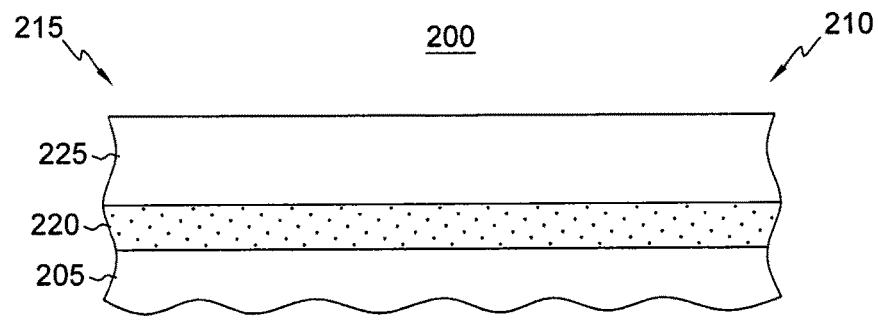
FIG. 2 depicts a cross-sectional elevation view of one embodiment of an intermediate semiconductor structure having a substrate including a logic area and an SRAM area, a fin material layer, and a hardmask layer, in accordance with one or more aspects of the present invention.

FIG. 2 shows a portion of an intermediate semiconductor device generally denoted 200, depicted at an intermediate semiconductor fabrication stage. The device 200 may have been processed through initial device processing steps in accordance with the design of the device 200 being fabricated. For example, the device 200 may include, for instance, a substrate 205 having a logic area 210 and an SRAM area 215. The substrate 205 may be any suitable material, for example, silicon. The respective logic area 210 and SRAM area 215 may be separated by any distance, and the orientation is not intended to be limiting.

In another embodiment (not shown), the substrate of device 200 may be, for example, a silicon on insulator (SOI) substrate (not shown). For example, the SOI substrate may include an isolation layer (not shown), which may be a local buried oxide region (BOX) or any suitable material for electrically isolating transistors, aligned with the gate structure. In some embodiments, the device is a portion of a front end of line (FEOL) portion of an integrated circuit (IC).

Still referring to FIG. 2, above substrate 205 may be a fin material layer 220, which may include any material from which fins may be formed including silicon and its derivatives, and a hardmask layer 225. These materials are known and may include any hardmask materials now known or later developed, including but not limited to amorphous silicon.

Figure 3:
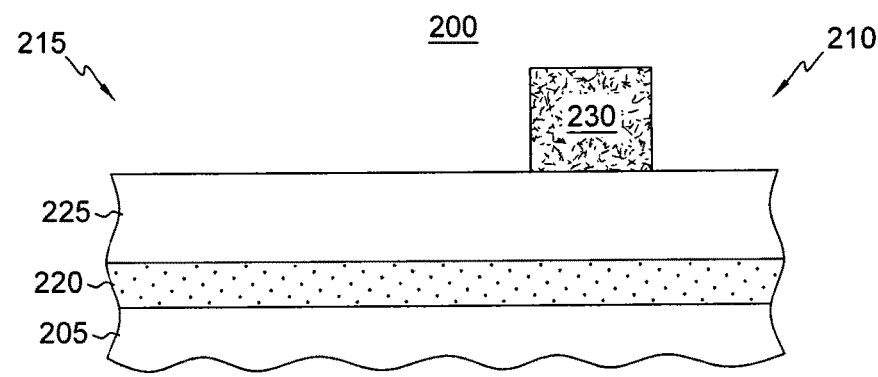
FIG. 3 depicts the structure of FIG. 2 after depositing a mandrel over the logic area, in accordance with one or more aspects of the present invention.

As depicted in FIG. 3, a mandrel 230 may be deposited over the logic area 210. While shown as a block mandrel over logic area 210, it is to be understood that the mandrel 230 may be etched from a continuous or near continuous layer deposited over hardmask layer 225. In these embodiments, the etching may include reactive ion etching (ME).

Figure 4:
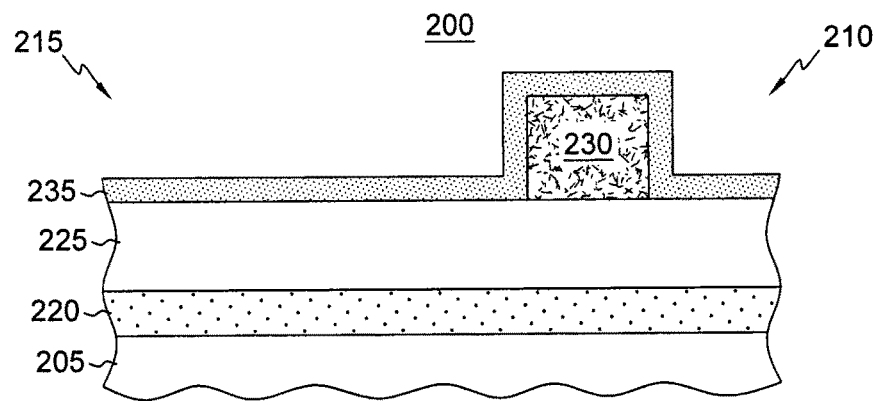
FIG. 4 depicts the structure of FIG. 3 after depositing a sacrificial spacer layer over the hardmask layer and the mandrel, in accordance with one or more aspects of the present invention.
Figure 5:
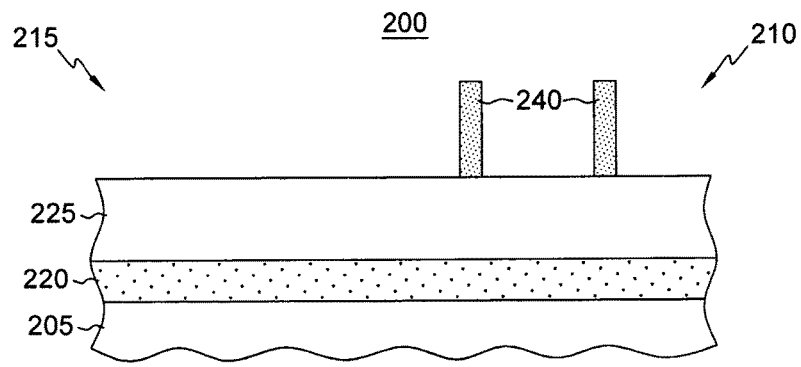
FIG. 5 depicts the structure of FIG. 4 after etching the sacrificial spacer layer and removing the mandrel to define a sacrificial set of vertical spacers, in accordance with one or more aspects of the present invention.

As depicted in FIG. 4, a sacrificial spacer layer 235 is deposited over the hardmask layer 225 and the mandrel 230. In FIG. 5, the sacrificial spacer layer 235 is etched and the mandrel 230 is removed, via a mandrel pull process, in order to define a sacrificial set of vertical spacers 240 over the logic area 210.

Figure 6:
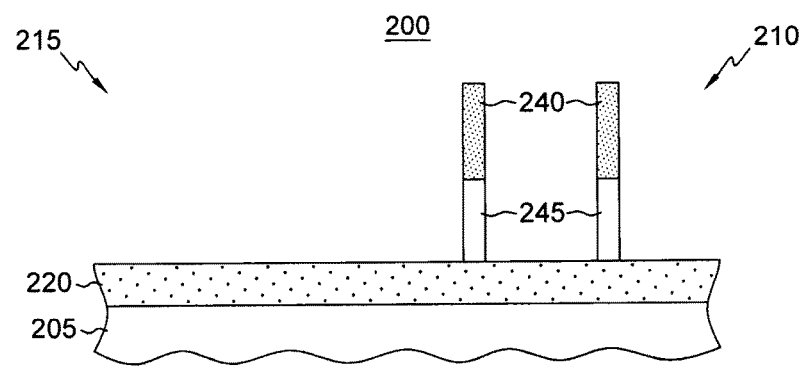
FIG. 6 depicts the structure of FIG. 5 after etching the hardmask layer around the sacrificial set of vertical spacers, in accordance with one or more aspects of the present invention.
Figure 7:
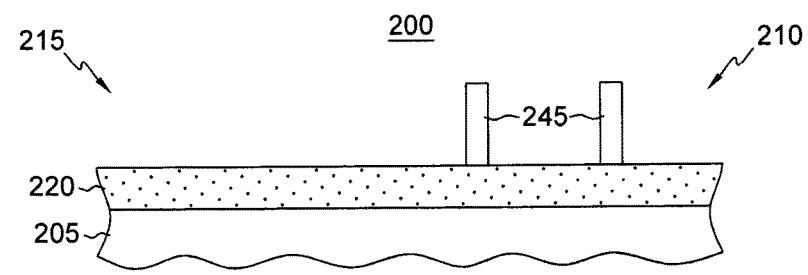
FIG. 7 depicts the structure of FIG. 6 after removing the sacrificial set of vertical spacers leaving a set of vertical hardmask spacers, in accordance with one or more aspects of the present invention.

As depicted in FIG. 6, using sacrificial vertical spacers 240 as a mask, the hardmask layer 225 is etched to remove hardmask layer 225 adjacent to the sacrificial set of vertical spacers 240, creating a set of vertical hardmask spacers 245 under the sacrificial spacers 240. As depicted in FIG. 7, the sacrificial set of vertical spacers 240 is removed, for instance by selective etching, leaving only the set of vertical hardmask spacers 245 above the fin material layer 220.

Figure 8:
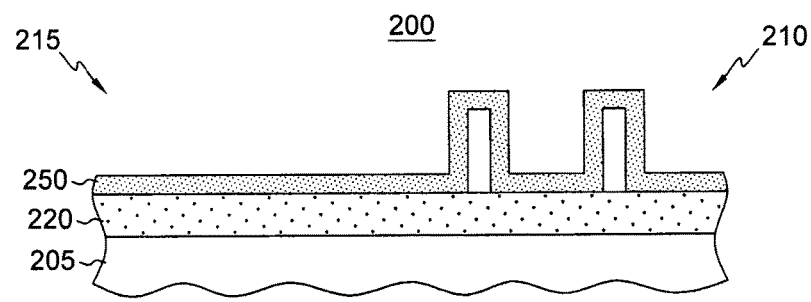
FIG. 8 depicts the structure of FIG. 7 after depositing a first spacer layer over the fin material layer and the set of vertical hardmask spacers, in accordance with one or more aspects of the present invention.
Figure 9:
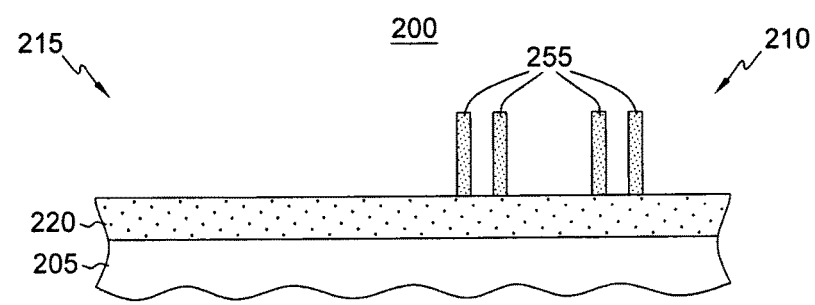
FIG. 9 depicts the structure of FIG. 8 after etching the first spacer layer and removing the set of vertical hardmask spacers to define a first set of vertical spacers over the logic area, in accordance with one or more aspects of the present invention.

As depicted in FIG. 8, a first spacer layer 250 may be deposited over the exposed fin material layer 220 and covering the set of vertical hardmask spacers 245. As depicted in FIG. 9, the first spacer layer 250 is etched and the set of vertical hardmask spacers 245 removed, for instance by etching or a pull process such as a silicon pull, in order to define and form a first set of vertical spacers 255 over the logic area 210. The process depicted and described in FIGS. 3-9 represent a partial order reduction (POR) self-aligned quadruple patterning (SAQP) process to pattern the logic area 210 of device 200. Accordingly, the number of spacers of the first set of vertical spacers 255 can include any multiple of 4.

Figure 10:
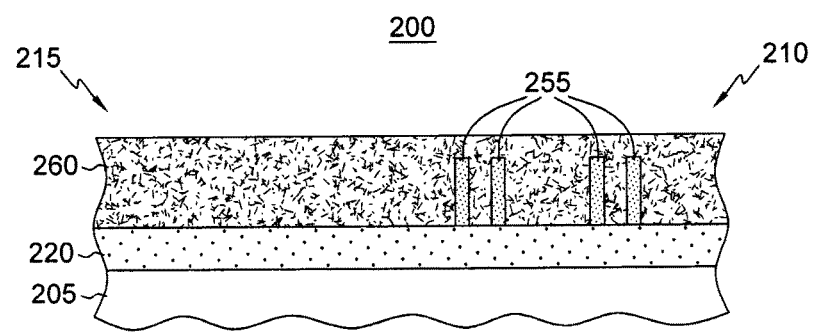
FIG. 10 depicts the structure of FIG. 9 after depositing a spin on hardmask (SOH) layer, in accordance with one or more aspects of the present invention.
Figure 11:
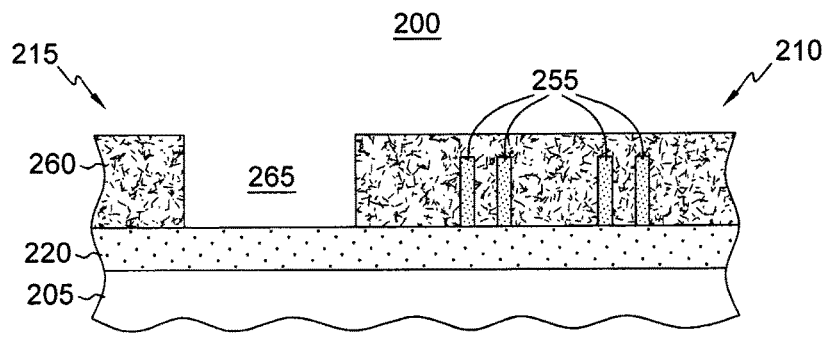
FIG. 11 depicts the device of FIG. 10 after etching an opening in the SOH layer over the SRAM area, in accordance with one or more aspects of the present invention.

As depicted in FIG. 10, the SRAM area 215 can be patterned following the logic area 210. For instance, a spin on hardmask (SOH) layer 260 may be deposited over the fin material layer 220, surrounding the first set of vertical spacers 255. The SOH layer 260 can include silicon hardmask materials, carbon hardmask materials, and organic hardmask materials. As depicted in FIG. 11, an opening 265 may be etched in the SOH layer 260 over the SRAM area 215. The size of this opening 265 will depend on the desired use of device 200 and is limited only by etching techniques. Embodiments, described below, enable expanding or shrinking opening 265 for different device 200 designs.

Figure 12:
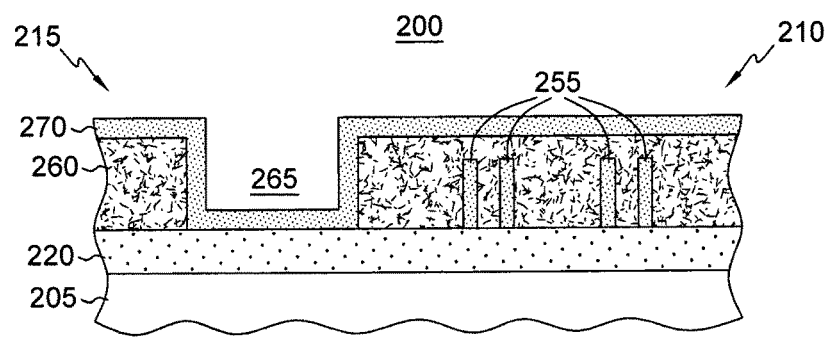
FIG. 12 depicts the device of FIG. 11 after depositing a second spacer layer, in accordance with one or more aspects of the present invention.

As depicted in FIG. 12, a second spacer layer 270 is deposited over SOH layer 260 and lining opening 265. The sacrificial spacer layer 235, first spacer layer 250, and third spacer layer 270 may all include the same or different materials, and may include but are not limited to an oxide material. Accordingly, the sacrificial set of vertical spacers 240, first set of vertical spacers 255, and second set of vertical spacers 275 may include the same or different materials and may be oxide materials. Any or all of the spacer layers may be deposited, for instance, using atomic layer deposition (ALD) or any other deposition method capable of consistent thin films.

Figure 13:
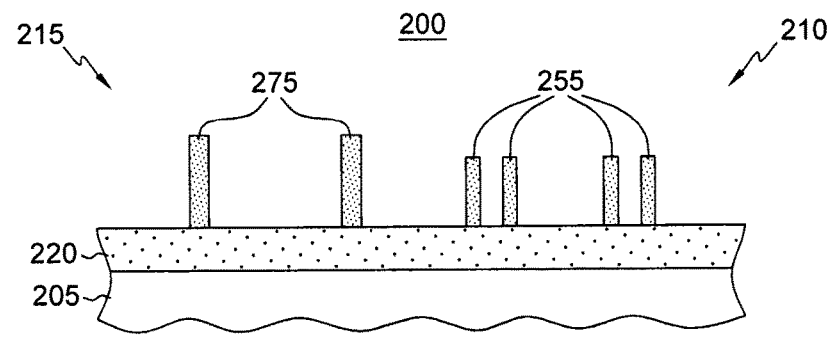
FIG. 13 depicts the device of FIG. 12 after etching the second spacer layer and removing the SOH layer to define a second set of spacers over the SRAM area, in accordance with one or more aspects of the present invention.

As depicted in FIG. 13, the second spacer layer 270 may be etched and the SOH layer 260 removed, for instance by a mandrel pull process, in order to define a second set of spacers 275 over the SRAM area 215 at the outside edges of where opening 265 was previously. Being a self-aligned double patterning (SADP) technique, the number of spacers in the second set of spacers 275 can include any multiple of 2 desired.

Embodiments described herein allow for shrinking the cell height of device 200 by utilizing a combination of POR SAQP techniques for patterning the logic area 210 and SADP techniques, as depicted in FIGS. 10-13, in the SRAM area 215, thus allowing for an increased packing density. Additionally, some embodiments allow for varying the fin space in the SRAM area 215.

Figure 14:
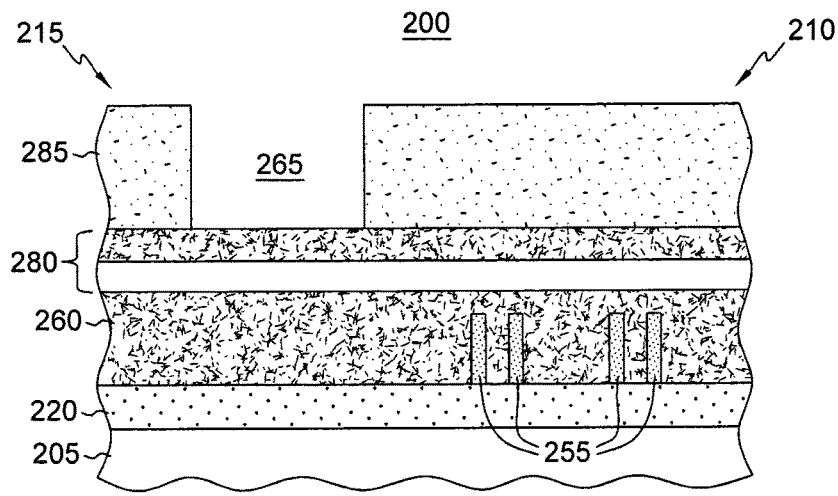
FIG. 14 depicts the device of FIG. 10 after depositing a bright field mask and resist to define a size of the opening in the SOH layer, in accordance with one or more aspects of the present invention.

For instance, in alternative embodiments, as depicted in FIGS. 14-18, a negative tone develop method can be used to shrink the critical dimension (CD) of opening 265. As depicted in FIG. 14, following the deposition of the SOH layer 260, as illustrated in FIG. 10, instead of etching opening 265 in SOH layer 260, a resist 280 and bright field mask 285 can be deposited over the SOH layer. Then, an opening 265 in the bright field mask 265 can be formed to define the size of the opening 265, eventually in SOH layer 260, through negative tone development, mask and resist removal via etching, and etching of the pattern formed, as described below. The bright field mask 265 can include, for instance, a chrome coated glass template, which can be etched to form the opening 265, and the resist 280 may include any known photoresist materials, such as poly (methyl methacrylate) (PMMA), poly(methyl glutarimide) (PMGI), and phenol formaldehyde resin, amongst others.

Figure 15:
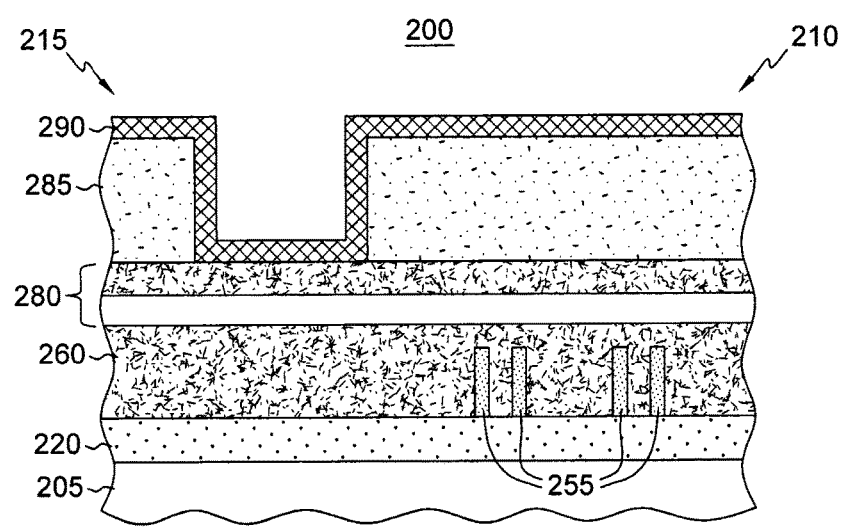
FIG. 15 depicts the device of FIG. 14 after depositing a carbon spacer layer over the resist, in accordance with one or more aspects of the present invention.

In some embodiments, forming of second set of vertical spacers 275 can proceed, however, for further shrinking of opening 265, as depicted in FIG. 15, a carbon spacer layer 290 may be deposited over bright field mask 285, lining opening 265. The carbon spacer layer 290 may include a layer of amorphous carbon, deposited for instance, by ALD.

Figure 16:
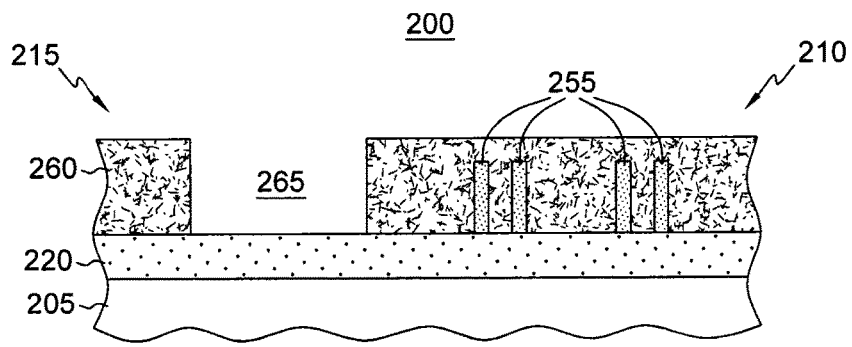
FIG. 16 depicts the device of FIG. 15 after etching the second spacer layer and removing the SOH layer to define a second set of spacers over the SRAM area, in accordance with one or more aspects of the present invention.
Figure 17:
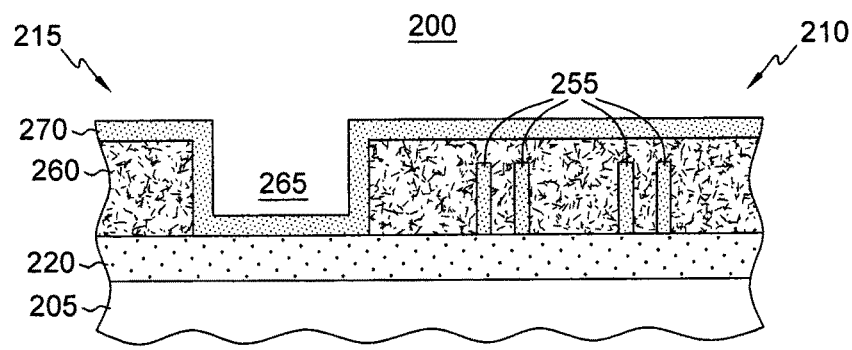
FIG. 17 depicts the device of FIG. 16 after depositing a second spacer layer, in accordance with one or more aspects of the present invention.
Figure 18:
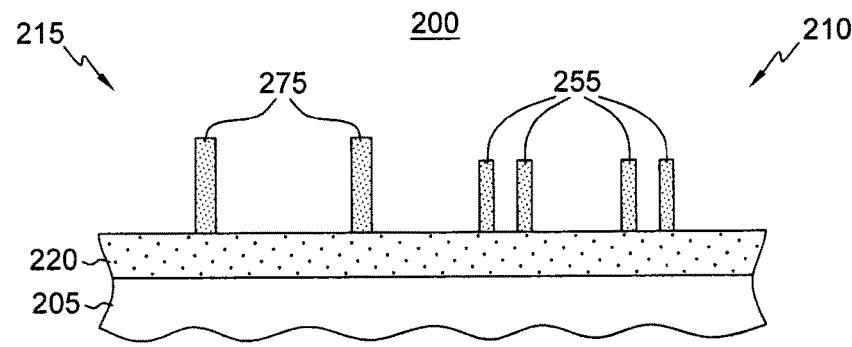
FIG. 18 depicts the device of FIG. 17 after etching the second spacer layer and removing the SOH layer to define a second set of spacers over the SRAM area, in accordance with one or more aspects of the present invention.
Figure 19:
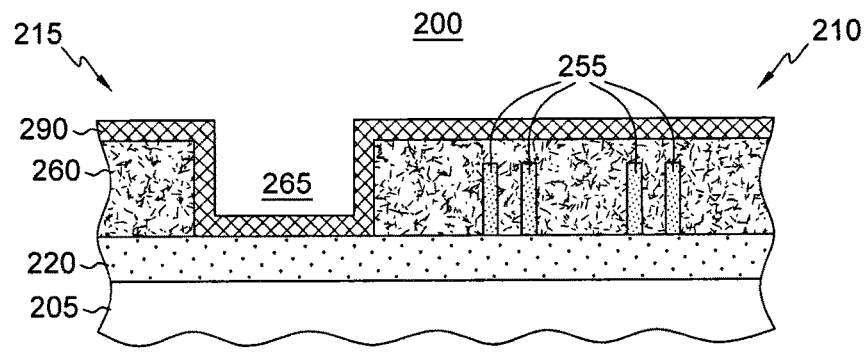
FIG. 19 depicts the device of FIG. 11 after depositing a carbon spacer layer over the SOH layer and the fin material layer in the SRAM area, in accordance with one or more aspects of the present invention.

As depicted in FIG. 16, using negative tone development techniques, the opening 265 can be formed in SOH layer 260, removing resist 280 and bright field mask 285. Then, as depicted in FIGS. 17 and 18, the second spacer layer 270 may be deposited and etched to form the second set of vertical spacers 275 as in FIGS. 12 and 13.

Figure 20:
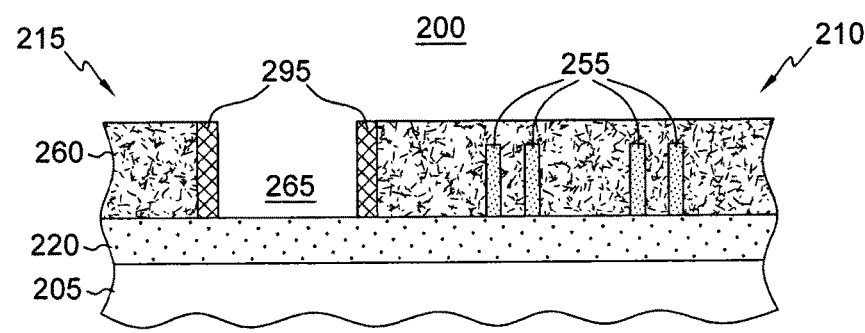
FIG. 20 depicts the device of FIG. 19 after etching the carbon spacer layer to define a set of carbon spacer layers in the opening in the SOH layer over the SRAM area, in accordance with one or more aspects of the present invention.

In another alternative set of embodiments, as depicted in FIGS. 19-22, just a carbon spacer can be used to shrink the CD of opening 265. For instance, following the etching of the opening 265 depicted in FIG. 11, a carbon spacer layer 290, as described above, can be deposited over SOH layer 260 lining opening 265. Then, using any compatible etching technique, the carbon spacer layer 290 may be etched to form a set of carbon spacers 295 lining opening 265, effectively shrinking the CD of the opening 265, as depicted in FIG. 20.

Figure 21:
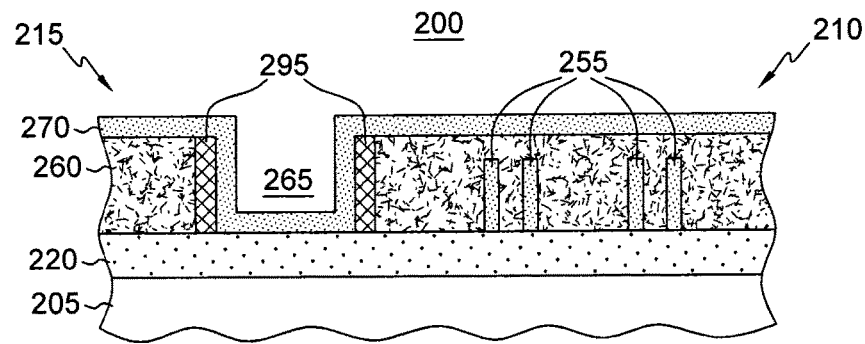
FIG. 21 depicts the device of FIG. 20 after depositing a second spacer layer, in accordance with one or more aspects of the present invention.
Figure 22:
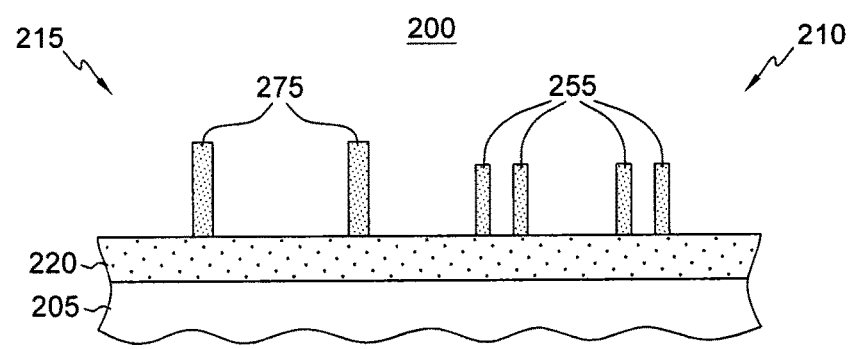
FIG. 22 depicts the device of FIG. 21 after etching the second spacer layer and removing the SOH layer to define a second set of spacers over the SRAM area, in accordance with one or more aspects of the present invention.

As depicted in FIG. 21, a second spacer layer 270, similar to the method of FIG. 12, may be deposited over the SOH layer 260 lining the opening 265 as shrunk by the set of carbon spacers 295 and over the SRAM area 215. As depicted in FIG. 21, as described above, the second spacer layer 270 may be etched and the SOH layer 260 and set of carbon spacers 295 removed, forming the second set of spacers 275 over the SRAM area 215.

Figure 23:
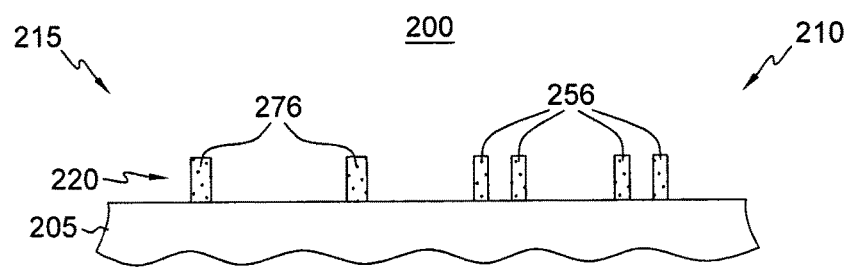
FIG. 23 depicts the device of FIG. 13, 18, or 22 after using the vertical spacers to cut and etch a set of fins.

Returning to FIGS. 13, 18, and 22, embodiments described above result in an intermediate semiconductor device 200 which includes a substrate 205 and a fin material layer 220 having a logic area 210 with a first set of spacers 255 formed thereon and a SRAM area 215 with a second set of spacers 275 formed thereon. As previously described, the spacers may include an oxide material. In a further embodiment, the intermediate semiconductor device 200 may be used to cut and etch the fins of a device. For instance, as depicted in FIG. 23, using the first and second set of vertical spacers 255 and 275 to determine the fin sizes and locations in the fin material 220, first and second set of fins 256 and 276 respectively, may be etched into the fin material 220, being substantially the same width of the vertical spacers 255 and 275 by etching the fin material layer 220 adjacent the area beneath the vertical spacers.

It should be appreciated that the novel intermediate semiconductor devices and methods of forming the same disclosed above decrease the cell height of the end device by requiring few mandrel layers than previous methods and by not requiring dummy structures for the SRAM area 215, increasing the possible packing densities of cells. Additionally, the combination of POR SAQP and SADP allow for varying fin widths in the SRAM area of the cell. This also allows for formation of the SRAM area without requiring a cut to the fin material layer, maintaining a continuous fin structure prior to etching of the fins, and negating the need for dummy fins frequently used in previous attempts.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features.

Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    obtaining an intermediate semiconductor device having a substrate, including a logic area, a mandrel over a logic area, and an SRAM area, a fin material layer, a hardmask layer, and a sacrificial spacer layer over the hardmask layer and the mandrel;
    etching the sacrificial spacer layer and removing the mandrel to define a sacrificial set of vertical spacers;
    etching the hardmask and removing the sacrificial set of vertical spacers leaving a set of vertical hardmask spacers;
    depositing a first spacer layer over the fin material layer and forming a first set of vertical spacers over the logic area;
    forming a spin on hardmask (SOH) layer and an opening in the SOH layer over the SRAM area; and
    forming a second spacer layer and removing the SOH layer to define a second set of spacers over the SRAM area.

2. The method of claim 1, further comprising:
    depositing the mandrel over the logic area;
    depositing the sacrificial spacer layer over the hardmask layer and the mandrel; and
    wherein the etching of the hardmask layer comprises etching around the sacrificial set of vertical spacers.

3. The method of claim 1, further comprising:
    wherein the depositing the first spacer layer includes depositing over the set of vertical hardmask spacers and etching the first spacer layer and removing the set of vertical hardmask spacers to define the first set of vertical spacers over the logic area;
    wherein the forming the SOH layer comprises depositing the SOH layer and forming the opening comprises etching the opening in the SOH layer; and
    wherein forming the second spacer layer includes depositing the second spacer layer.

4. The method of claim 3, further comprising:
    depositing, following the depositing the SOH layer, a bright field mask and resist to define a size of the opening in the SOH layer;
    depositing a carbon spacer layer over the resist; and
    using negative tone development to etch the opening in the SOH layer.

5. The method of claim 4, wherein the carbon spacer layer comprises amorphous carbon.

6. The method of claim 5, wherein the carbon spacer layer is deposited using atomic layer deposition.

7. The method of claim 3, further comprising:
    depositing, following the etching an opening in the SOH layer over the SRAM area, a carbon spacer layer over the SOH layer and the fin material layer in the SRAM area; and
    etching the carbon spacer layer to define a set of carbon spacers in the opening in the SOH layer over the SRAM area, shrinking the opening prior to the depositing of the second spacer layer.

8. The method of claim 7, wherein the carbon spacer layer comprises amorphous carbon.

9. The method of claim 8, wherein the carbon spacer layer is deposited using atomic layer deposition.

10. The method of claim 1, further comprising:
    forming a set of fins using the first set of vertical spacers and the second set of vertical spacers to determine fin size and location.

11. The method of claim 1, wherein the hardmask layer comprises amorphous silicon.

12. The method of claim 1, wherein the sacrificial, first, and second spacer layers comprise an oxide material.

13. The method of claim 12, wherein the sacrificial, first, and second spacer layers are deposited using atomic layer deposition.

14. The method of claim 1, wherein the first set of spacers comprises a multiple of 4 spacers.

15. The method of claim 1, wherein the second set of spacers comprises a multiple of 2 spacers.

* * * * *